US012689360B2

(12) United States Patent
Chen

(10) Patent No.: US 12,689,360 B2
(45) Date of Patent: Jul. 21, 2026

(54) METHOD FOR REDUCING INFLUENCE OF NOISE ON SIGNAL LINE, DECODING CIRCUIT AND POWER PROVIDING/RECEIVING DEVICE USING THE SAME

(71) Applicant: NUVOTON TECHNOLOGY CORPORATION, Hsinchu City (TW)

(72) Inventor: Chih-Ming Chen, Zhubei City (TW)

(73) Assignee: NUVOTON TECHNOLOGY CORPORATION, Hsinchu City (TW)

( * ) Notice: Subject to any disclaimer, the term of this patent is extended or adjusted under 35 U.S.C. 154(b) by 63 days.

(21) Appl. No.: 18/749,999

(22) Filed: Jun. 21, 2024

(65) Prior Publication Data

US 2025/0202463 A1 Jun. 19, 2025

(30) Foreign Application Priority Data

Dec. 14, 2023 (TW) .................................. 112148650

(51) Int. Cl.
H03K 5/1252 (2006.01)
H03K 5/24 (2006.01)
(52) U.S. Cl.
CPC ............. H03K 5/1252 (2013.01); H03K 5/24 (2013.01)

(58) Field of Classification Search
CPC ...... H03K 5/1252; H03K 5/24; H03K 5/2472; H03K 5/2481; H03K 5/22; H03K 5/2409; H03K 5/2418; H03K 5/2445; H03K 5/1532; H03K 19/00346; H03M 13/1105; H03M 13/03; G06F 13/4282; G06F 18/10; G11C 7/062; G01R 17/00; G01R 17/02; G01R 19/165; G01R 19/16566; G01R 19/16571; G01R 19/16576
See application file for complete search history.

(56) References Cited

U.S. PATENT DOCUMENTS

2002/0034143 A1* 3/2002 Kaneshige et al. .... G11B 20/18

* cited by examiner

*Primary Examiner* — Jung Kim
(74) *Attorney, Agent, or Firm* — MUNCY, GEISSLER, OLDS & LOWE, P.C.

(57) ABSTRACT

A method for reducing influence of noise on a signal line, a decoding circuit and a power provider are disclosed. The method includes steps of: dividing an analog signal to be decoded into levels; determining the level of the analog signal and acquiring the current level of the analog signal to be decoded to obtain a current level number; updating a highest level variable when the current level number is greater than the highest level variable; updating a lowest level variable when the current level number is smaller than the lowest level variable; and outputting an edge detection pulse and setting the highest level variable and the lowest level variable equal to the current level number when the difference between the highest level variable and the lowest level variable is greater than a noise tolerance value.

5 Claims, 9 Drawing Sheets

METHOD FOR REDUCING INFLUENCE OF NOISE ON SIGNAL LINE, DECODING CIRCUIT AND POWER PROVIDING/RECEIVING DEVICE USING THE SAME

CROSS-REFERENCE TO RELATED APPLICATION

This application claims the priority benefit of Taiwan application serial no. 112148650, filed Dec. 14, 2023, the full disclosure of which is incorporated herein by reference.

BACKGROUND

Technical Field

The present invention relates to a noise-reducing technique, and particularly relates to a method for reducing the influence of noise on a signal line, a decoding circuit using the same and a power providing/receiving device using the same.

Description of Related Art

Automatic charging devices are prevalent nowadays, and the Universal Serial Bus Power Delivery (USB PD) protocol is the most widely used transmission protocol at present. In addition to the charging and discharging through the VBUS pin, another related interface signal of the main transmission interface thereof is on the channel configuration pin (CC pin). Due to the voltage level of the CC pin during the process of data transmission (the bit rate being approximately 300 Kb/s) being approximately 1.1V, when the process of data transmission is subject to the interference of any noise, the effect of data being correctly received during the process of data transmission in the USB PD may be influenced.

In addition to including power supply, the USB PD protocol also processes the coordination of the data flow, data format and master-slave relation between two devices. When transforming signals into digital, the data packets of the USB PD protocol also include the calculation and comparison of cyclic redundancy check (CRC) during the transmission through the CC pin to avoid the usage of incorrect packet data due to the influence of noise.

However, when the detection of noise is strengthened and the occurrence of noise is reduced before the bi-phase mark codes (BMC), or packets using any other form of coding, are transformed into digital signals, the system application may be more stable and the performance of data transmission may be more optimized in terms of the performance of the USB PD protocol.

SUMMARY

The present invention provides a method for reducing the influence of noise on a signal line, a decoding circuit using the same and a power providing/receiving device using the same, configured to strengthen the detection of noise and reduce the occurrence of noise before transforming a carrier wave into a digital signal.

An embodiment of the present invention provides a method for reducing the influence of noise on a signal line, including: comparing a voltage level of an analog signal to be decoded with multiple reference voltage levels, to determine a current level number of the analog signal to be decoded, wherein the analog signal is received from the signal line; updating a highest level variable when the current level number is greater than the highest level variable; updating a lowest level variable when the current level number is smaller than the lowest level variable; and when a difference between the lowest level variable and the highest level variable is greater than a noise tolerance value, outputting an edge detection pulse; and based on the edge detection pulse, generating a decoding signal.

An embodiment of the present invention provides a decoding circuit, the decoding circuit including a plurality of comparators, a noise filtering and signal edge detection circuit and a digital signal data processing circuit. Each of the plurality of comparators includes a first terminal, a second terminal and an output terminal. The first terminal of each of the plurality of comparators receives an analog signal to be decoded, and the second terminal of each of the plurality of comparators is coupled to a corresponding reference voltage level, in which each of the plurality of reference voltage levels is distinct. The noise filtering and signal edge detection circuit is coupled to the output terminals of the comparators, in which signals output by the plurality of comparators are set with a corresponding level in the noise filtering and signal edge detection circuit.

In an embodiment, the noise filtering and signal edge detection circuit determines a level of the analog signal to be decoded based on the signals output from the output terminals of the comparators to determine a current level of the analog signal to be decoded to obtain a current level number. In an embodiment, the noise filtering and signal edge detection circuit has a highest level variable and a lowest level variable therein. When the current level number is greater than the highest level variable, the highest level variable is updated to the current level number. When the current level number is smaller than the lowest level variable, the lowest level variable is updated to the current level number. When a difference between the lowest level variable and the highest level variable is greater than a noise tolerance value, the noise filtering and signal edge detection circuit outputs an edge detection pulse, sets the highest level variable and the lowest level variable as the current level number, and continuously determines the level of the analog signal to be decoded to obtain the current level number. The digital signal data processing circuit is coupled to an output terminal of the noise filtering and signal edge detection circuit, and generates a decoded signal based on the edge detection pulse.

According to a method for reducing influence of noise on a signal line, a decoding circuit using the same and a power provider using the same described in the preferred embodiments of the present invention, the analog signal to be decoded is obtained from a channel configuration pin (CC pin) of a Universal Serial Bus (USB) connection port. In a preferred embodiment of the present invention, the analog signal to be decoded is modulated based on a bi-phase mark code (BMC).

To further understand the technology, means and effects of the present invention, the following detailed description and accompanied drawings may be referred to understand the goals, features and concepts of the present invention thoroughly and specifically. However, the following detailed description and drawings are merely provided as references and explanations of the embodiments of the present invention and not as limitations of the present invention.

BRIEF DESCRIPTION OF THE DRAWINGS

The drawings are provided for persons skilled in the art of the present invention to further understand the present invention and are incorporated into and constitute part of the disclosure of the present invention. The drawings show exemplary embodiments of the present invention and are used to explain the principles of the present invention alongside the Specification of the present invention.

DETAILED DESCRIPTION

Figure 1:
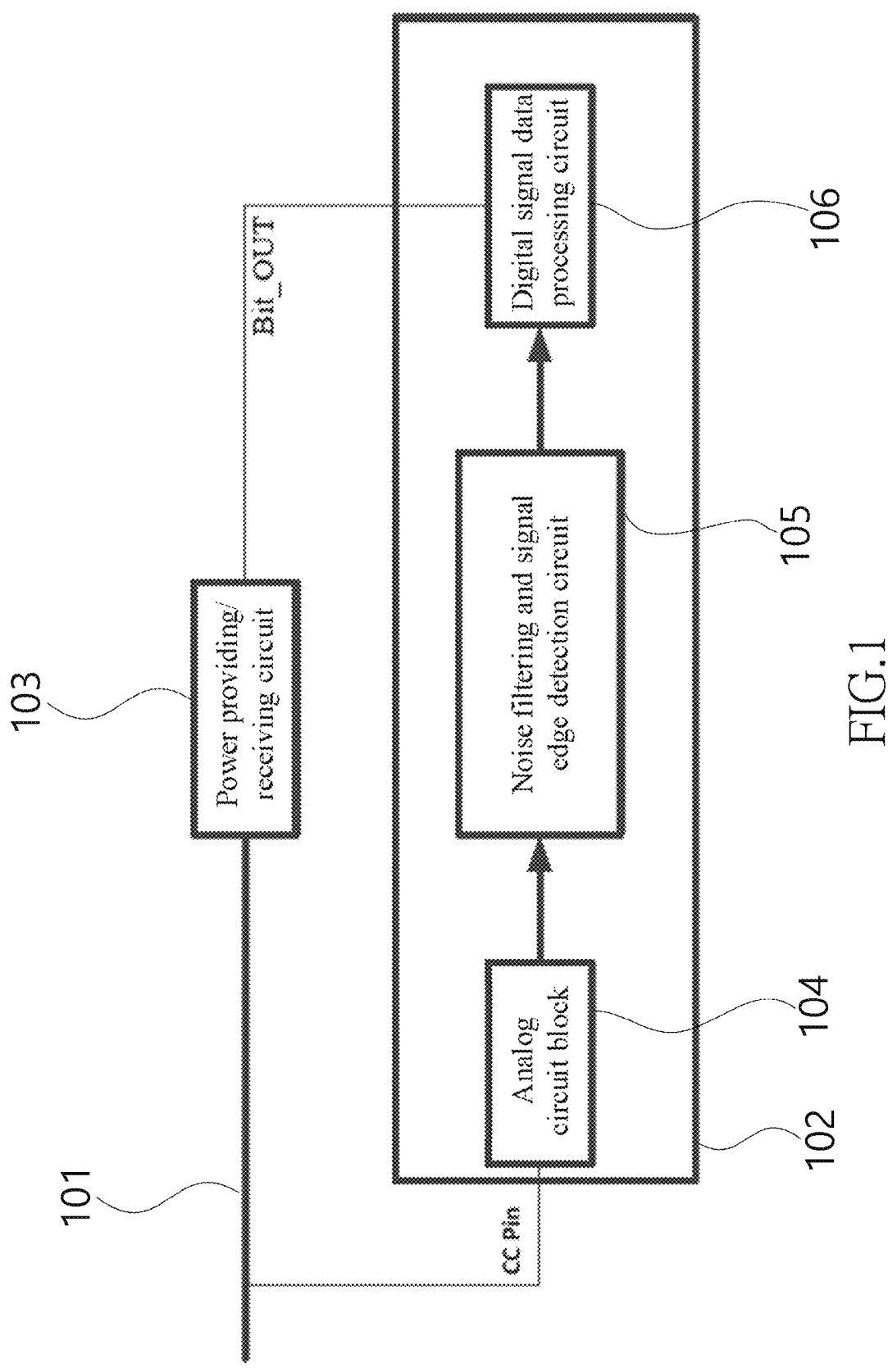
FIG. 1 is illustrated as a schematic diagram of a power providing/receiving device of a preferred embodiment of the present invention.

Herein, exemplary embodiments of the present invention are referred to in detail, and the exemplary embodiments are shown in the drawings. Same element numerals are used to represent same or similar elements in the drawings and Specification whenever possible. Also, the approach of exemplary embodiments is merely one of the realizations of the design concepts of the present invention, and the following plurality of examples are not intended to limit the present invention.

FIG. 1 is illustrated as a schematic diagram of a power providing/receiving device of a preferred embodiment of the present invention. Referring to FIG. 1, in the present embodiment, a power providing/receiving device using the Universal Serial Bus Power Delivery (USB PD) protocol is illustrated as an example. The power providing/receiving device includes a Universal Serial Bus (USB) connection port 101, a decoding circuit 102 and a power providing/receiving circuit 103. The USB connection port 101 includes a channel configuration pin CC Pin. The decoding circuit 102 includes an analog circuit block 104, a noise filtering and signal edge detection circuit 105 and a digital signal data processing circuit 106. The power providing/receiving circuit 103 is coupled to the USB connection port 101 and the decoding circuit 102, receives a decoding signal Bit_OUT (a bit output of packet data) provided by the decoding circuit 102, and communicates power capacity and needs with a device coupled to the other end of the USB connection port 101 thereby. When receiving data, in a USB PD system, a voltage signal is inputted through the CC pin, and the processing of digital sampling is needed to transform the data into real digital data with noise removed so that the content on a data packet may be decoded.

Figure 2:
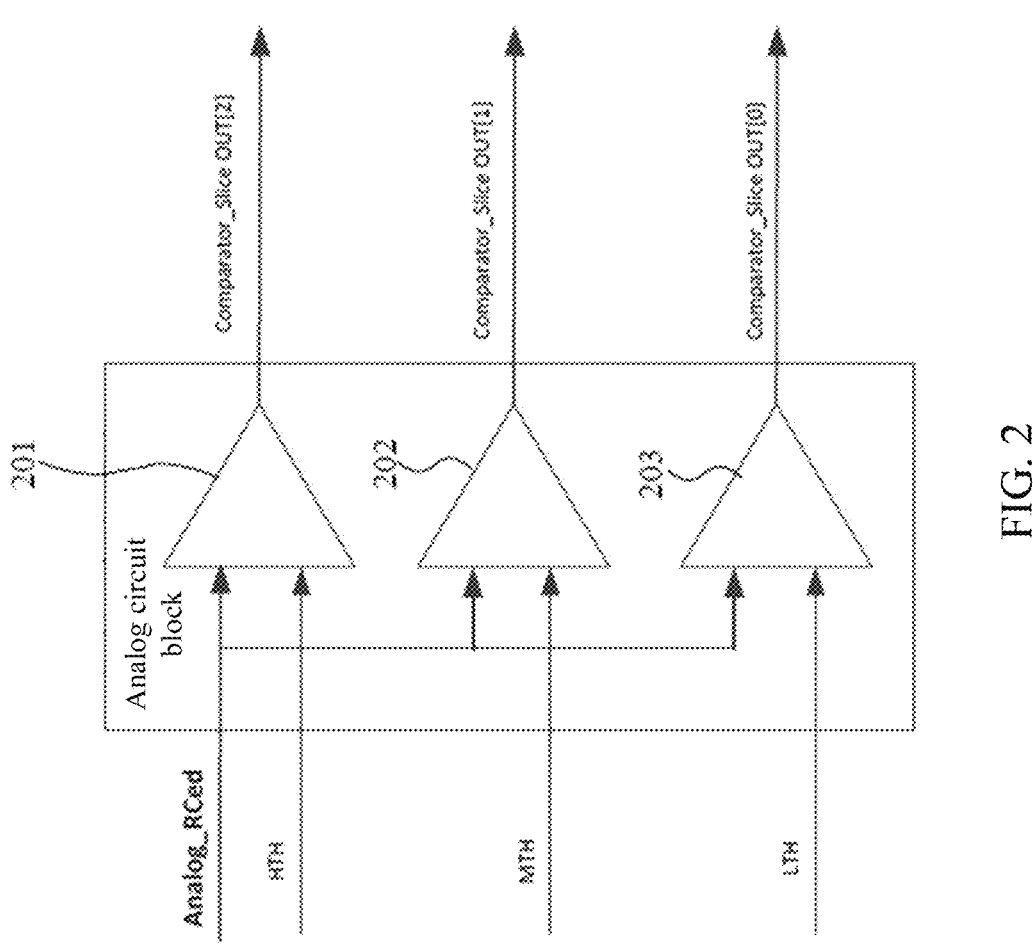
FIG. 2 is illustrated as a circuit diagram of an analog circuit block 104 of a preferred embodiment of the present invention.

FIG. 2 is illustrated as a circuit diagram of an analog circuit block 104 of a preferred embodiment of the present invention. Referring to FIG. 2, in the present embodiment, an analog circuit block 104 includes a first comparator 201, a second comparator 202 and a third comparator 203. Each of the comparators 201, 202 and 203 includes a first terminal, a second terminal and an output terminal respectively. The first terminal of each of the comparators 201, 202 and 203 receives an analog signal to be decoded Analog_RCed from the channel configuration pin CC Pin, the second terminal of each of the comparators 201, 202 and 203 is coupled to a corresponding reference voltage level, which is HTH (high threshold), MTH (middle threshold) and LTH (low threshold) respectively. The comparison signals output by the output terminals of the comparators 201, 202 and 203 are labeled herein as Comparator_Slice OUT[2], Comparator_Slice OUT[1] and Comparator_Slice OUT[0] respectively.

The noise filtering and signal edge detection circuit 105 is coupled to the output terminals of the comparators 201, 202 and 203, in which three variables are set in the noise filtering and signal edge detection circuit 105, namely a highest level variable Hi_count, a lowest level variable Low_count and a current level number in_level.

Figure 3:
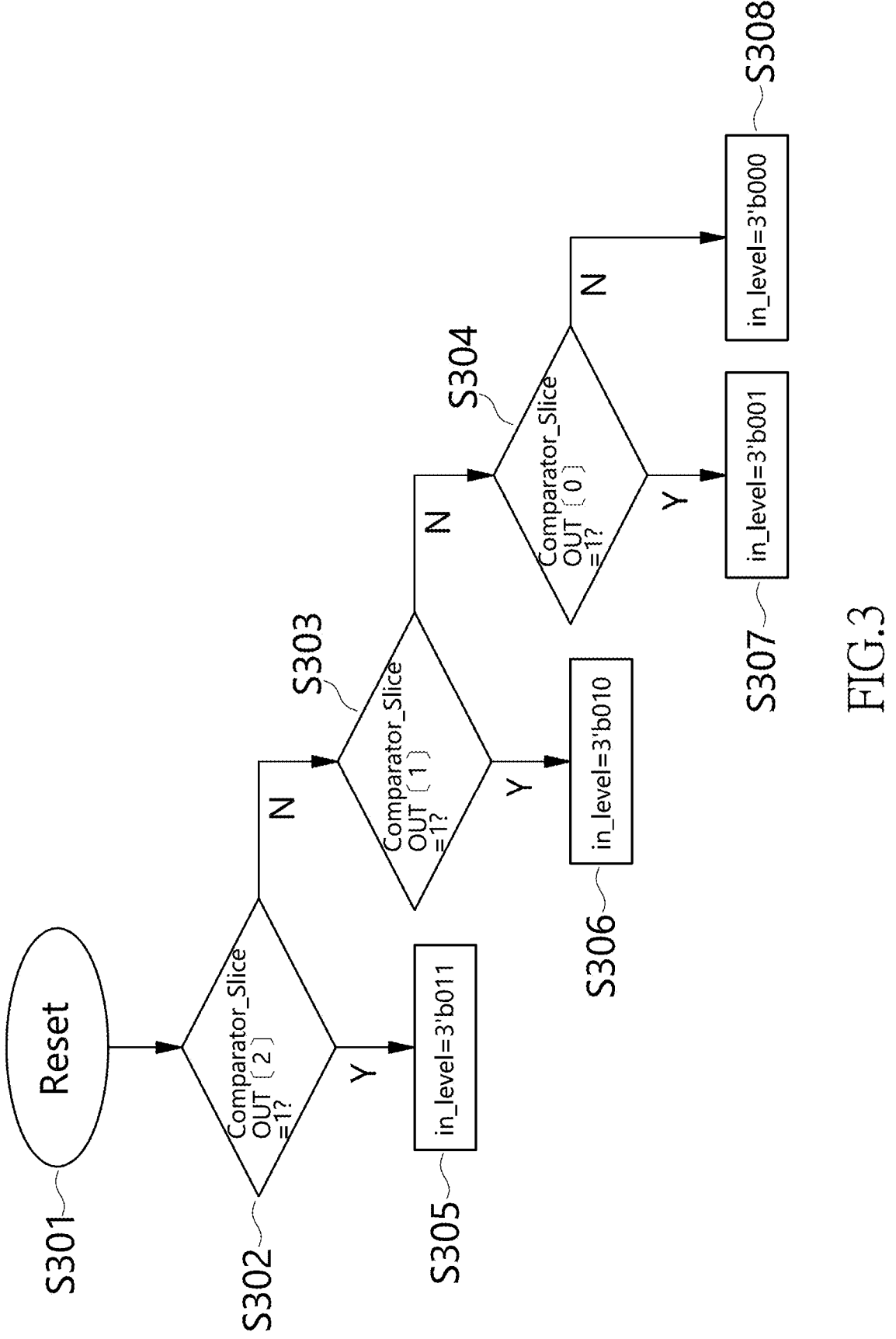
FIG. 3 is illustrated as a flow diagram of a noise filtering and signal edge detection circuit 105 when operating a current level number in_level of a preferred embodiment of the present invention.

FIG. 3 is illustrated as a flow diagram of a noise filtering and signal edge detection circuit 105 when operating a current level number in_level of a preferred embodiment of the present invention. Referring to FIG. 3, in the present embodiment, the operation of the noise filtering and signal edge detection circuit 105 when operating the current level number in_level includes the following steps.

Step S301: Initial reset.

Step S302: Determine whether the signal Comparator_Slice OUT[2] at the output terminal of the comparator 201 is a logical high voltage. When the determination result is yes, a step S305 is performed. When the determination result is no, a step S303 is performed.

Step S303: Determine whether the signal Comparator_Slice OUT[1] at the output terminal of the comparator 202 is a logical high voltage. When the determination result is yes, a step S306 is performed. When the determination result is no, a step S304 is performed.

Step S304: Determine whether the signal Comparator_Slice OUT[0] at the output terminal of the comparator 203 is a logical high voltage. When the determination result is yes, a step S307 is performed. When the determination result is no, a step S308 is performed.

Step S305: Set the current level number in_level as a 3-bit number 011.

Step S306: Set the current level number in_level as a 3-bit number 010.

Step S307: Set the current level number in_level as a 3-bit number 001.

Step S308: Set the current level number in_level as a 3-bit number 000.

The execution time (sampling time) of the aforementioned flow steps may be designed according to different needs and is omitted herein.

Figure 4:
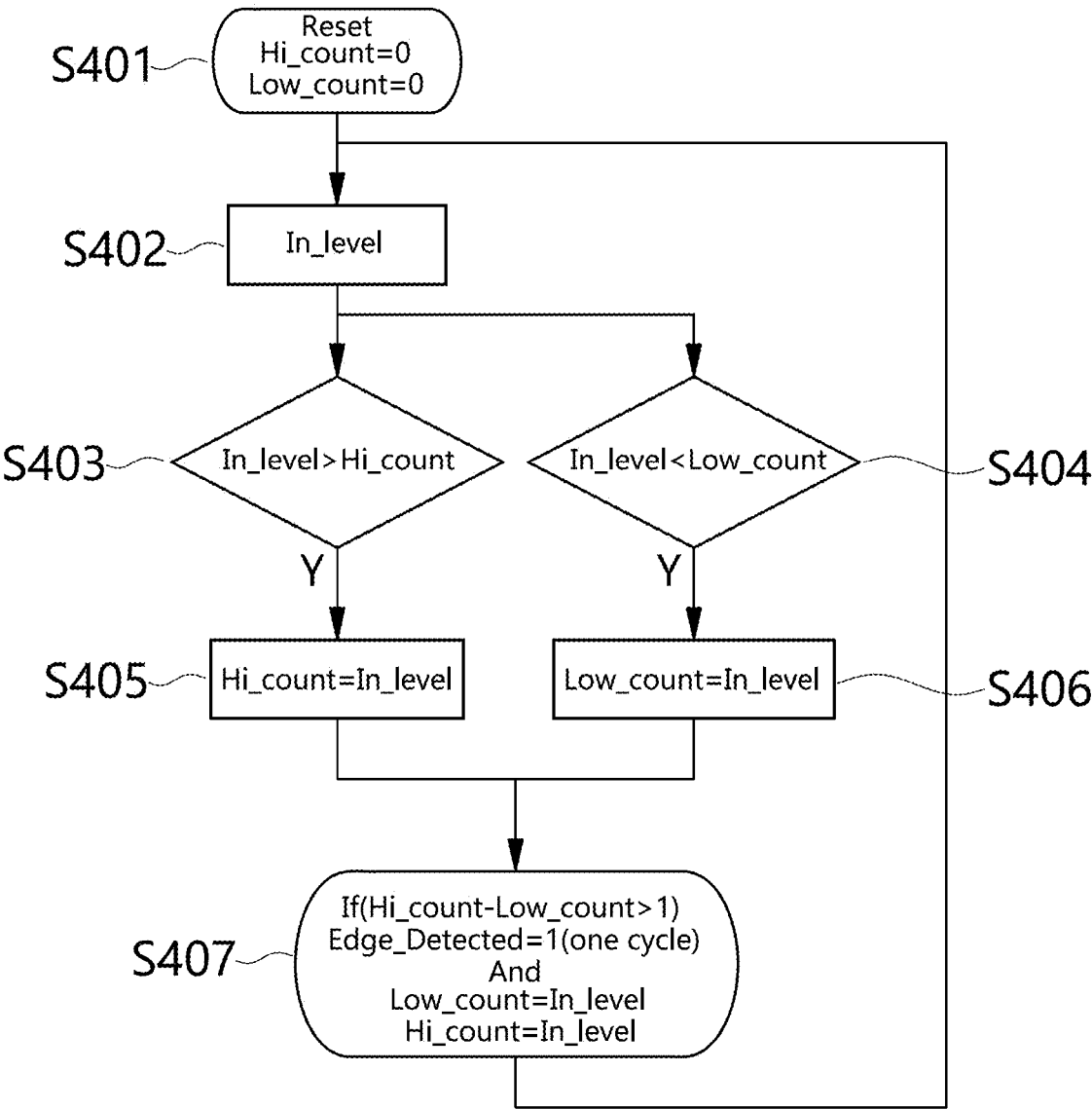
FIG. 4 is illustrated as a flow diagram of a noise filtering and signal edge detection circuit 105 when operating a highest level variable Hi_count and a lowest level variable Low_count of a preferred embodiment of the present invention.

FIG. 4 is illustrated as a flow diagram of a noise filtering and signal edge detection circuit 105 when operating a highest level variable Hi_count and a lowest level variable Low_count of a preferred embodiment of the present invention. Referring to FIG. 4, the operation of the noise filtering and signal edge detection circuit 105 when operating the highest level variable Hi_count and the lowest level variable Low_count includes the following steps.

Step S401: Initial reset. Set the highest level variable Hi_count and the lowest level variable Low_count as 0.

Step S402: Input the current level number in_level.

Step S403: Determine whether the current level number in_level is greater than the highest level variable Hi_count. When the determination result is yes, a step S405 is performed.

Step S404: Determine whether the current level number in_level is smaller than the lowest level variable Low_count. When the determination result is yes, a step S406 is performed.

Step S405: Set the highest level variable Hi_count as the current level number in_level. Subsequently, a step S407 is performed.

Step S406: Set the lowest level variable Low_count as the current level number in_level. Subsequently, the step S407 is performed.

Step S407: Determine whether a difference between the highest level variable Hi_count and the lowest level variable Low_count is greater than a noise tolerance value. In the present embodiment, the noise tolerance value is set as 1. When the difference between the highest level variable Hi_count and the lowest level variable Low_count is greater than the noise tolerance value, trigger the noise filtering and signal edge detection circuit 105 to output an edge detection pulse, and set the highest level variable Hi_count and the lowest level variable Low_count as the current level number in_level.

Figure 5:
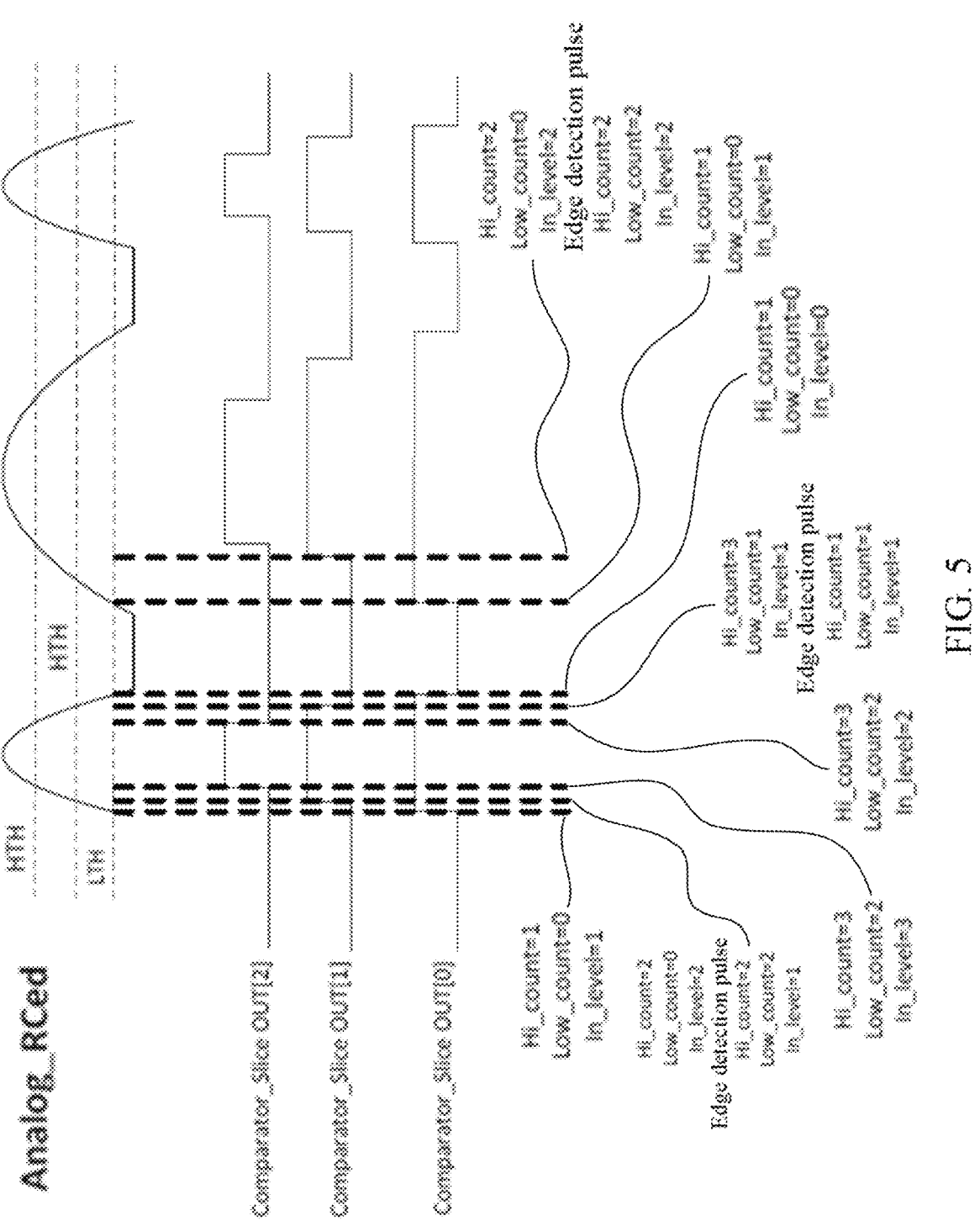
FIG. 5 is illustrated as a waveform graph of a noise filtering and signal edge detection circuit 105 of a preferred embodiment of the present invention.

FIG. 5 is illustrated as a waveform graph of a noise filtering and signal edge detection circuit 105 of a preferred embodiment of the present invention. Referring to FIG. 5, to make persons skilled in the art understand the embodiments shown in aforementioned FIGS. 3 and 4, a graph is illustrated to visualize the variables, and the changes of the variables are marked in the graph. It may be understood that at the beginning, when the signal Comparator_Slice OUT[0] at the output terminal of the comparator 203 is changed from a logical low voltage to a logical high voltage, through the flow shown in FIG. 4, the highest level variable Hi_count is changed to 1, the lowest level variable Low_count remains at 0, and the current level number in_level is changed from 0 to 1. Subsequently, when the signal Comparator_Slice OUT[1] at the output terminal of the comparator 202 is changed from a logical low voltage to a logical high voltage, through the flow shown in FIG. 4, the highest level variable Hi_count is changed to 2, the lowest level variable Low-_count remains at 0, and the current level number in_level is changed from 1 to 2. Due to the step S407 being triggered herein, at this time, the noise filtering and signal edge detection circuit 105 outputs the edge detection pulse, and the highest level variable Hi_count is changed to 2, the lowest level variable Low_count is changed to 2 as well, and the current level number in_level is changed to 2.

Subsequently, when the signal Comparator_Slice OUT[2] at the output terminal of the comparator 201 is changed from a logical low voltage to a logical high voltage, through the flow shown in FIG. 4, the highest level variable Hi_count is changed to 3, the lowest level variable Low_count remains at 2, and the current level number in_level is changed from 2 to 3. Subsequently, when the signal Comparator_Slice OUT[2] at the output terminal of the comparator 201 is changed from a logical high voltage to a logical low voltage, through the flow shown in FIG. 4, the highest level variable Hi_count remains at 3, the lowest level variable Low_count remains at 2, and the current level number in_level is changed from 3 to 2. When the signal Comparator_Slice OUT[1] at the output terminal of the comparator 202 is changed from a logical high voltage to a logical low voltage, through the flow shown in FIG. 4, the highest level variable Hi_count remains at 3, the lowest level variable Low_count is changed to 1, and the current level number in_level is changed from 2 to 1. Similarly, at this time, due to the step S407 being triggered herein, the noise filtering and signal edge detection circuit 105 outputs the edge detection pulse, and the highest level variable Hi_count is changed to 1, the lowest level variable Low_count is changed to 1 as well, and the current level number in_level is changed to 1.

Subsequently, when the signal Comparator_Slice OUT[0] at the output terminal of the comparator 203 is changed from a logical high voltage to a logical low voltage, through the flow shown in FIG. 4, the highest level variable Hi_count remains at 1, the lowest level variable Low_count is changed to 0, and the current level number in_level is changed from 1 to 0. Subsequently, when the signal Comparator_Slice OUT[0] at the output terminal of the comparator 203 is changed from a logical low voltage to a logical high voltage, through the flow shown in FIG. 4, the highest level variable Hi_count remains at 1, the lowest level variable Low_count remains at 0, and the current level number in_level is changed from 0 to 1. The following embodiments may be inferred from the aforementioned principles and are thus omitted herein.

Figure 6:
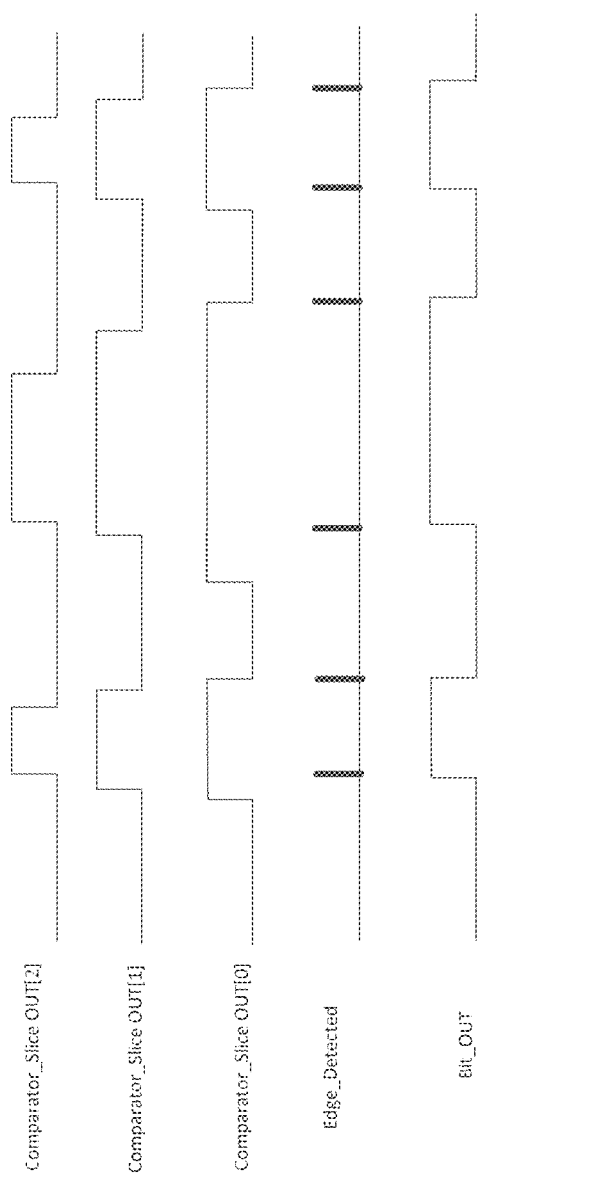
FIG. 6 is illustrated as a waveform graph of a noise filtering and signal edge detection circuit 105 of a preferred embodiment of the present invention.

FIG. 6 is illustrated as a waveform graph of a noise filtering and signal edge detection circuit 105 of a preferred embodiment of the present invention. Referring to FIG. 6, in the graph, the label Edge_Detected refers to the edge detection pulse output by the noise filtering and signal edge detection circuit 105, and the label Bit_OUT refers to a noise-removed decoded signal Bit_OUT decoded by the digital signal data processing circuit 106 based on the aforementioned edge detection pulse output by the noise filtering and signal edge detection circuit 105.

Figure 7:
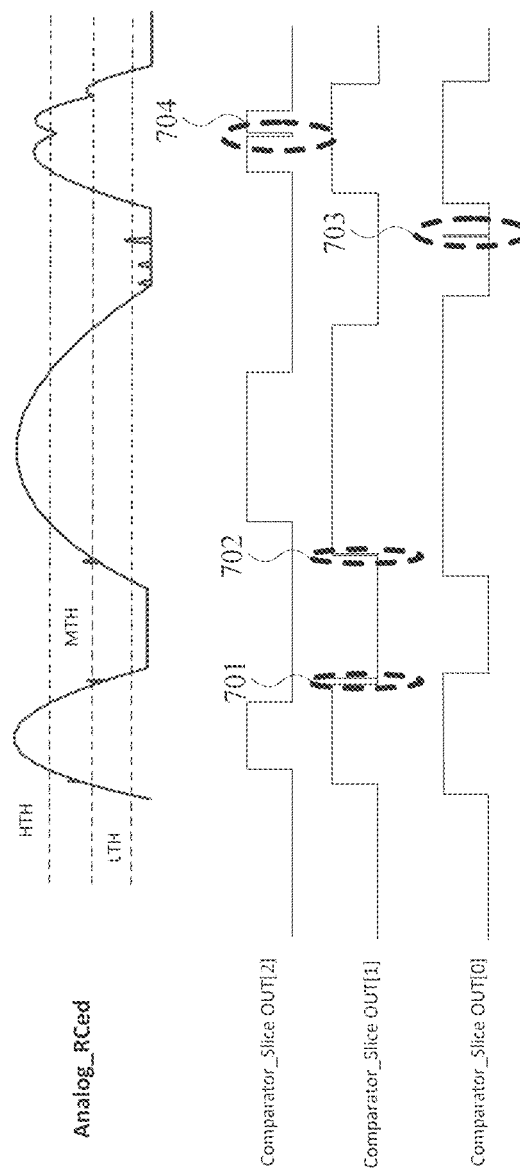
FIG. 7 is illustrated as a waveform graph of a first comparator 201, a second comparator 202 and a third comparator 203 while encountering noise of a preferred embodiment of the present invention.

FIG. 7 is illustrated as a waveform graph of a first comparator 201, a second comparator 202 and a third comparator 203 while encountering noise of a preferred embodiment of the present invention. Referring to FIG. 7, in the present embodiment, it may be understood that when the analog signal to be decoded Analog_RCed encounters noise passing through the reference voltage levels HTH, MTH and LTH, the comparators 201, 202 and 203 are triggered and changed, causing the comparators 201, 202 and 203 to output inappropriate noise pulses 701, 702, 703 and 704 respectively.

Figure 8:
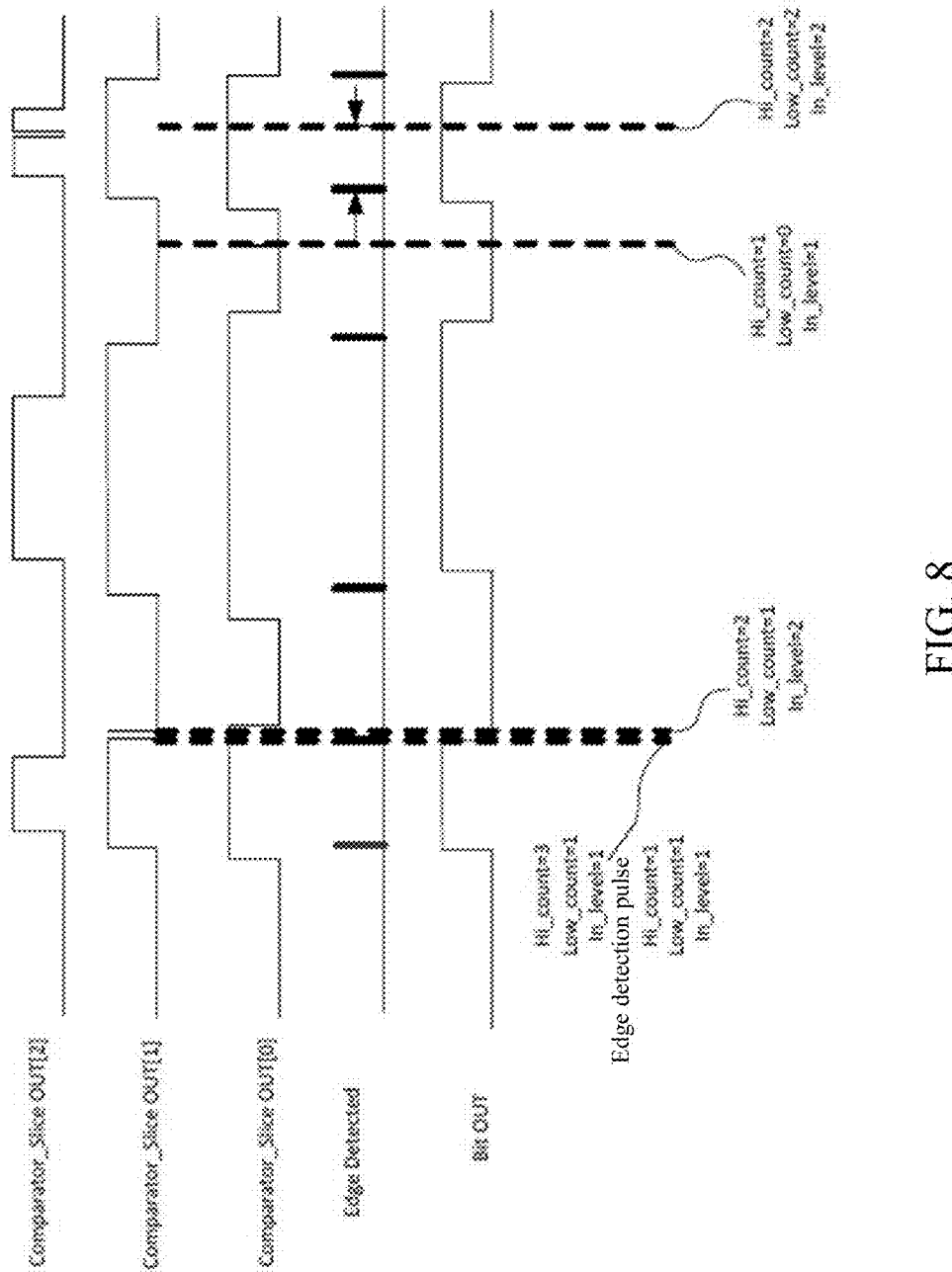
FIG. 8 is illustrated as a waveform graph of a noise filtering and signal edge detection circuit 105 of a preferred embodiment of the present invention.

FIG. 8 is illustrated as a waveform graph of a noise filtering and signal edge detection circuit 105 of a preferred embodiment of the present invention. Referring to FIG. 8, in the present embodiment, it may be understood that before the time period of the numeral 701, due to the triggering of the step S407, the highest level variable Hi_count and the lowest level variable Low_count are both set as 1. Thus, at the time period of the numeral 701, the highest level variable Hi_count is changed to 2 and the lowest level variable Low_count remains at 1, and thus the noise filtering and signal edge detection circuit 105 is not triggered to output the edge detection pulse. Similarly, at the time period of the numeral 703, the highest level variable Hi_count is 1 and the lowest level variable Low_count remains at 0, and thus the noise filtering and signal edge detection circuit 105 is not triggered to output the edge detection pulse. At the time period of the numeral 704, the highest level variable Hi_count is 2 and the lowest level variable Low_count remains at 2, and thus the noise filtering and signal edge detection circuit 105 is not triggered to output the edge detection pulse as well.

In the foregoing embodiments, to make persons skilled in the art understand the present invention, three comparators 201, 202 and 203 and three values are described as examples, and the aforementioned noise tolerance value is simply set as 1. However, after referring to the foregoing embodiments, persons skilled in the art should readily understand that the noise tolerance value should be designed greater as the numbers of comparators and values increase to obtain a more precise result of noise filtering. In addition, although the foregoing embodiments use the USB PD protocol as examples and thus use BMC decoding as examples, persons skilled in the art should understand that the techniques disclosed in the present invention may be applied to other coding methods of other fields of application, such as Manchester coding, to decode and filter noise as well, and thus the present invention is not limited thereto.

Figure 9:
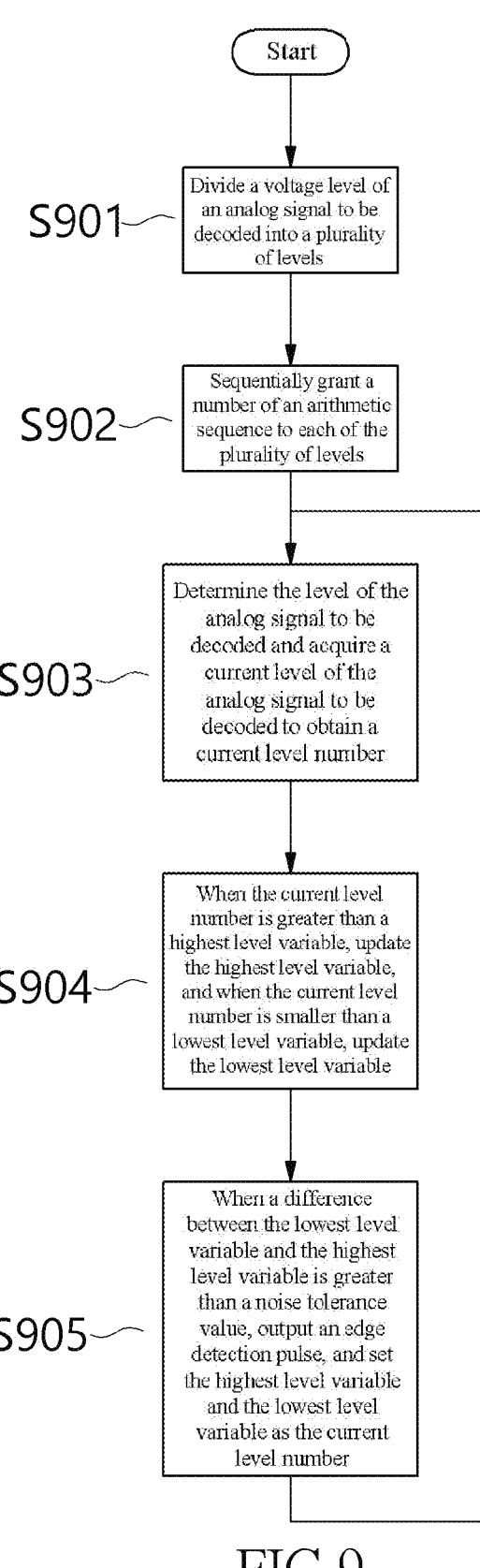
FIG. 9 is illustrated as a flow diagram of a method for reducing the influence of noise on a signal line of a preferred embodiment of the present invention.

FIG. 9 is illustrated as a flow diagram of a method for reducing the influence of noise on a signal line of a preferred embodiment of the present invention. Referring to FIG. 9, the method for reducing the influence of noise on a signal line includes the following steps.

Step S901: Divide a voltage level of an analog signal to be decoded into a plurality of levels. As described in the embodiment shown in FIG. 2, use a plurality of comparators to detect the voltage level of the analog signal to be decoded.

Step S902: Sequentially grant a number of an arithmetic sequence to each of the plurality of levels. As described in the foregoing preferred embodiments, in an embodiment, 3-bit numbers of 1, 2 and 3 (that is, 001, 010 and 011) are used. Persons skilled in the art may use other numbers such as 2, 4 and 6 as well, and the present invention is not limited thereto. The aforementioned numbers may vary based on the amount of difference between levels.

Step S903: Determine the level of the analog signal to be decoded and acquire a current level of the analog signal to be decoded to obtain a current level number. The method thereof is shown in FIG. 3. In other words, the step 901, the step 902, the step 903 are performed to compare the voltage level of the analog signal with multiple reference voltage levels, to determine the current level number of the analog signal.

Step S904: When the current level number is greater than a highest level variable, update the highest level variable, and when the current level number is smaller than a lowest level variable, update the lowest level variable. The method thereof is shown in the steps S403 to S406 of the foregoing embodiments.

Step S905: When a difference between the lowest level variable and the highest level variable is greater than a noise tolerance value, output an edge detection pulse, set the highest level variable and the lowest level variable as the current level number, and continuously determine the level of the analog signal to be decoded and obtain the current level number. The method thereof is shown in the step S407 of aforementioned FIG. 4. After that, a subsequent decoding circuit may decode a noise-removed decoded signal based on a time interval between the edge detection pulses.

In summary, in embodiments of the present invention, a plurality of levels are set, and values corresponding to the plurality of levels, a current level number, a highest level variable and a lowest level variable are defined. A plurality of time periods of an analog signal to be decoded arriving at the plurality of levels are detected, and, based on the levels the analog signal to be decoded arriving at, the current level number, the highest level variable and the lowest level variable are changed. When a difference between the highest level variable and the lowest level variable is greater than a noise tolerance value, an edge detection pulse is triggered, and the highest level variable and the lowest level variable are set equal to the current level number. Accordingly, even when the difference between the highest level variable and the lowest level variable is changed due to the influence of noise, the operation of the circuit may remain uninfluenced when the difference is smaller than the noise tolerance value.

It should be understood that the examples and embodiments described herein are merely intended to be used as explanations, and various modifications or alterations in view of which are suggested to persons skilled in the art and are included within the spirit and scope and the scope of the appended claims of the present disclosure.

What is claimed is:

1. A decoding circuit, comprising:
   a plurality of comparators, wherein each of the plurality of comparators comprises a first terminal, a second terminal and an output terminal, the first terminal of each of the plurality of comparators receives an analog signal to be decoded, and the second terminal of each of the plurality of comparators is coupled to a corresponding reference voltage level, wherein each of the plurality of reference voltage levels is distinct;
   a noise filtering and signal edge detection circuit, coupled to the output terminals of the plurality of comparators;
   wherein the noise filtering and signal edge detection circuit determines a current level of the analog signal to be decoded based on signals output from the output terminals of the comparators to obtain a current level number;
   wherein the noise filtering and signal edge detection circuit has a highest level variable and a lowest level variable therein;
   wherein when the current level number is greater than the highest level variable, the highest level variable is updated to the current level number;
   wherein when the current level number is smaller than the lowest level variable the lowest level variable is updated to the current level number;
   wherein, when a difference between the lowest level variable and the highest level variable is greater than a noise tolerance value, the noise filtering and signal edge detection circuit outputs an edge detection pulse, sets the highest level variable and the lowest level variable as the current level number, and continuously determines the voltage level of the analog signal to be decoded to obtain the current level number;
   wherein the decoding circuit further comprises:
   a digital signal data processing circuit, coupled to an output terminal of the noise filtering and signal edge detection circuit, and generating a decoded signal based on the edge detection pulse.

2. The decoding circuit of claim 1, wherein the analog signal to be decoded is obtained from a channel configuration pin (CC pin) of a Universal Serial Bus (USB) connection port.

3. The decoding circuit of claim 1, wherein the analog signal to be decoded is modulated based on a bi-phase mark code (BMC), and the digital signal data processing circuit is a BMC decoding circuit.

4. A power providing/receiving device, comprising:

a Universal Serial Bus (USB), comprising a channel configuration pin (CC pin), the power providing/receiving device being coupled to an exterior device through the USB;

a decoding circuit, comprising:

a plurality of comparators, wherein each of the plurality of comparators comprises a first terminal, a second terminal and an output terminal, the first terminal of each of the plurality of comparators is coupled to the CC pin and receives an analog signal to be decoded through the CC pin, and the second terminal of each of the plurality of comparators is coupled to a corresponding reference voltage level, wherein the plurality of reference voltage levels are distinct;

a noise filtering and signal edge detection circuit, coupled to the output terminals of the plurality of comparators;

wherein the noise filtering and signal edge detection circuit determines a current level of the analog signal to be decoded based on signals output from the output terminals of the comparators to obtain a current level number;

wherein the noise filtering and signal edge detection circuit has a highest level variable and a lowest level variable therein;

wherein when the current level number is greater than the highest level variable the highest level variable is updated to the current level number;

wherein when the current level number is smaller than the lowest level variable the lowest level variable is updated to the current level number;

wherein, when a difference between the lowest level variable and the highest level variable is greater than a noise tolerance value, the noise filtering and signal edge detection circuit outputs an edge detection pulse, sets the highest level variable and the lowest level variable as the current level number, and continuously determines the voltage level of the analog signal to be decoded to obtain the current level number;

wherein the decoding circuit further comprises:

a digital signal data processing circuit, coupled to an output terminal of the noise filtering and signal edge detection circuit, and generating a decoded signal based on a time period of the edge detection pulse;

wherein the power providing/receiving device further comprises:

a power providing/receiving circuit, coupled to a connection port of the USB, and receiving the decoded signal;

wherein the power providing/receiving circuit communicates with the coupled exterior device based on the decoded signal.

5. The power providing/receiving device of claim 4, wherein the analog signal to be decoded is modulated based on a bi-phase mark code (BMC), and the digital signal data processing circuit is a BMC decoding circuit.

* * * * *